United States Patent
Hsu et al.

(10) Patent No.: US 10,637,347 B1
(45) Date of Patent: Apr. 28, 2020

(54) ABNORMAL POWER FAILURE CONTROL SYSTEM AND METHOD

(71) Applicant: ANPEC ELECTRONICS CORPORATION, Hsinchu (TW)

(72) Inventors: Chun-Kai Hsu, Hsinchu (TW); Kun-Yi Lin, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/543,435

(22) Filed: Aug. 16, 2019

(30) Foreign Application Priority Data

May 15, 2019 (TW) .................................. 108116726

(51) Int. Cl.
*H02M 3/158* (2006.01)
*H02M 1/32* (2007.01)
*H03K 5/24* (2006.01)
*H02M 1/08* (2006.01)
*H02M 1/00* (2006.01)

(52) U.S. Cl.
CPC .............. *H02M 1/32* (2013.01); *H02M 1/08* (2013.01); *H02M 3/1582* (2013.01); *H03K 5/24* (2013.01); *H02M 2001/0009* (2013.01)

(58) Field of Classification Search
CPC .......... H02M 1/08; H02M 1/32; H02M 3/156; H02M 3/158; H02M 3/1582; H02M 2001/0009; H03M 3/157; H03K 5/24; H03K 5/2472
See application file for complete search history.

(56) References Cited

U.S. PATENT DOCUMENTS

| | | | | |
|---|---|---|---|---|
| 9,071,140 | B2* | 6/2015 | Zhang | H02M 3/1582 |
| 9,685,860 | B2* | 6/2017 | Yin | H02M 3/157 |
| 2011/0199062 | A1* | 8/2011 | Singnurkar | H02M 3/1582 323/282 |
| 2014/0084883 | A1* | 3/2014 | Tanabe | H02M 3/1582 323/271 |
| 2015/0364997 | A1* | 12/2015 | Deng | H02M 3/1582 323/271 |

* cited by examiner

*Primary Examiner* — Matthew V Nguyen
(74) *Attorney, Agent, or Firm* — Li & Cai Intellectual Property (USA) Office

(57) ABSTRACT

An abnormal power failure control system and a method thereof are provided. The system includes a first comparator, a boost-buck control circuit, a logic control circuit, a switch circuit, a current sensor circuit, a current slope comparator circuit, a second comparator, and a mode switching circuit. The first comparator compares a stored power with a first reference voltage source to output a first voltage compared signal. The boost-buck control circuit outputs a boost-buck control signal and the logic control circuit accordingly controls the switch circuit. The current slope comparator circuit determines change of a slope of a current of the switch circuit. The second comparator compares the stored power with the second reference voltage to output a second voltage compared signal. The mode switching circuit instructs the logic control circuit to control the switch circuit.

7 Claims, 5 Drawing Sheets

ABNORMAL POWER FAILURE CONTROL SYSTEM AND METHOD

CROSS-REFERENCE TO RELATED PATENT APPLICATION

This application claims the benefit of priority to Taiwan Patent Application No. 108116726, filed on May 15, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a control system, and more particularly to an abnormal power failure control system and a method.

BACKGROUND OF THE DISCLOSURE

Data storage technologies of solid state drives (SSDs) have been developed rapidly over the past several decades. The solid state drives have gradually replaced conventional magnetic recording hard disk drives (HDDs) in many applications. The solid state drive and the conventional magnetic recording hard disk apply significantly different power drop protection mechanisms. The solid state drive caches data including more complicated metadata. In order to ensure the integrity of the metadata and the user data, they need be completely written to memory cells. For applications in enterprises, after the solid state drive is powered down and power is restored to the solid state drive, the solid state drive must be able to normally operate and all data must be able to be correctly read out from the memory cells.

SUMMARY OF THE DISCLOSURE

In response to the above-referenced technical inadequacies, the present disclosure provides an abnormal power failure control system, which is applicable for a power supply device and a power storage device. The power storage device stores a supplied power provided by the power supply device in a boost mode. The power storage device provides a stored power to the power supply device and the power supply device supplies the stored power in a buck mode. The abnormal power failure control system includes a first comparator, a boost-buck control circuit, a logic control circuit, a switch circuit, a current sensor circuit, a current slope comparator circuit, a second comparator, and a mode switching circuit. The first comparator has a first comparison input terminal and a second comparison input terminal, which are respectively connected to a first reference voltage source and the power storage device. The first comparator is configured to compare the stored power with a voltage of the first reference voltage source to output a first voltage compared signal. The boost-buck control circuit is configured to output a boost-buck control signal. The logic control circuit is connected to output terminals of the boost-buck control circuit and the first comparator. The logic control circuit is configured to determine whether or not the logic control circuit transmits the boost-buck control signal having a boost mode induction message according to the first voltage compared signal. The switch circuit is connected between the power supply device and the power storage device and to the logic control circuit. The switch circuit is configured to be switched to operate in the boost mode and boost the supplied power to obtain the stored power to be stored based on the boost-buck control signal, or to not be switched. The current sensor circuit is connected to the switch circuit and configured to sense a current flowing through the switch circuit. The current slope comparator circuit is connected to the current sensor circuit and configured to compare a slope of the current with a slope of a reference current to output a current slope changing signal. The second comparator has a third comparison input terminal and a fourth comparison input terminal, which are respectively connected to the power storage device and a second reference voltage source. The second comparator is configured to compare the stored power with a voltage of the second reference voltage source to output a second voltage compared signal. The mode switching circuit is connected to the current slope comparator circuit and the second comparator. The mode switching circuit is configured to instruct the logic control circuit to control the switch circuit to operate in the boost mode or switch the switch circuit to operate in the buck mode according to the current slope changing signal and the second voltage compared signal. The mode switching circuit is configured to allow the supplied power to be boosted by the switch circuit to obtain the stored power to be stored in the boost mode, or allow the stored power to be bucked by the switch circuit to obtain the supplied power to be supplied in the buck mode.

In one aspect, the present disclosure provides an abnormal power failure control method, which is applicable for a power supply device and a power storage device. The power storage device stores a supplied power provided by the power supply device in a boost mode. The power storage device provides a stored power to the power supply device and the power supply device supplies the stored power in a buck mode. The abnormal power failure control method includes the following steps: comparing the stored power with a voltage of a first reference voltage source to output a first voltage compared signal by a first comparator; outputting a boost-buck control signal by a boost-buck control circuit; determining whether or not a logic control circuit transmits the boost-buck control signal having a boost mode induction message to a switch circuit to switch the switch circuit to operate in the boost mode according to the first voltage compared signal by the logic control circuit; sensing a current flowing through the switch circuit by a current sensor circuit; comparing a slope of the current with a slope of a reference current to output a current slope changing signal by a current slope comparator circuit; comparing the stored power with a voltage of a second reference voltage source to output a second voltage compared signal by a second comparator; and instructing the logic control circuit to control the switch circuit to continuously operate in the boost mode or switch the switch circuit to operate in the buck mode according to the current slope changing signal and the second voltage compared signal by a mode switching circuit. When the switch circuit operates in the boost mode, the supplied power is allowed to be boosted by the switch circuit to obtain the stored power to be stored, and when the switch circuit operates in the buck mode, the stored power is allowed to be bucked by the switch circuit to obtain the supplied power to be supplied in the buck mode.

As described above, the present disclosure provides the abnormal power failure control system and method, which may enter the boost mode to control the power storage device to store the supplied power provided by the power supply device when the power supply device can be normally powered. However, when the power supply device is abnormally powered down, the abnormal power failure control system is switched to operate in the buck mode, and controls the power supply device to obtain the stored power from the power storage device as a backup power supply device and then supply the stored power to the other circuit components. Under this condition, the other circuit components can continually execute the unfinished programs that are not damaged by the abnormal power failure, for example, the memory device can continually access the data, without waiting until the power is restored.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
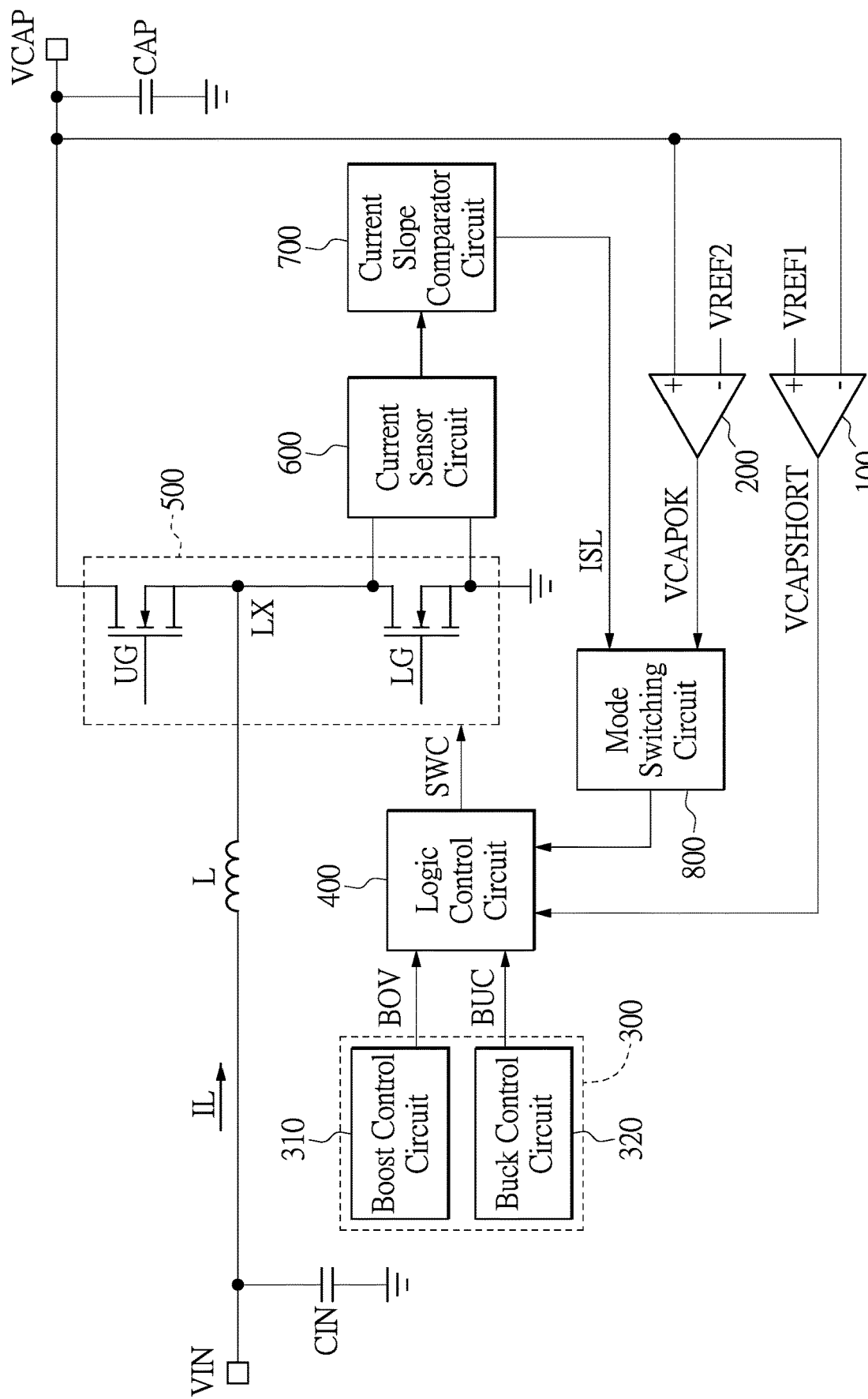
FIG. 1 is a circuit layout diagram of an abnormal power failure control system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit layout diagram of an abnormal power failure control system according to a first embodiment of the present disclosure. As shown in FIG. 1, the abnormal power failure control system includes a first comparator 100, a second comparator 200, a boost-buck control circuit 300, a logic control circuit 400, a switch circuit 500, a current sensor circuit 600, a current slope comparator circuit 700 and a mode switching circuit 800, which are applicable for a power supply device and a power storage device.

The abnormal power failure control system may control the power supply device to provide a supplied power VIN to be boosted and then stored in the power storage device in the boost mode. The supplied power VIN may be provided to electronic circuit components that require power, such as a solid state hard disk in the boost mode. However, when the power supply device is abnormally powered down and fails to supply power normally, the abnormal power failure control system enters the buck mode. The abnormal power failure control system turns to control the power storage device as a backup device to provide stored power VCAP to be bucked in the buck mode. The power supply device obtains the bucked stored power VCAP and then supplies the bucked stored power VCAP to those electronic circuit components in the buck mode. That is, the power storage device stores the stored power VCAP as backup power of the supplied power VIN of the power supply device, as described in detail in the following.

More specifically, the first comparator 100 has a first comparison input terminal and a second comparison input terminal. The first comparison input terminal such as a non-inverting terminal of the first comparator 100 is connected to a first reference voltage source VREF1. The second comparison input terminal such as an inverting terminal of the first comparator 100 is connected to the power storage device through a node at which the stored power VCAP is provided.

The power storage device includes a storage capacitor CAP. An upper terminal of the storage capacitor CAP may be connected to the power supply device through the switch circuit 500. In addition, the upper terminal of the storage capacitor CAP may be connected to the second comparison input terminal such as the inverting terminal of the first comparator 100. A lower terminal of the storage capacitor CAP is grounded.

The first comparator 100 may obtain a first reference voltage from the first reference voltage source VREF1 through the first comparison input terminal. The first comparator 100 may obtain the stored power VCAP from the power storage device through the second comparison input terminal. The first comparator 100 is configured to compare a voltage of the stored power VCAP of the power storage device with a voltage of the first reference voltage source VREF1 to output a first voltage compared signal VCAPSHORT.

An output terminal of the first comparator 100 is connected to the logic control circuit 400. For example, when the voltage of the stored power VCAP of the power storage device is higher than the voltage of the first reference voltage source VREF1, the first comparator 100 outputs the first voltage compared signal VCAPSHORT at a low level to the logic control circuit 400.

The boost-buck control circuit 300 includes a boost control circuit 310 and a boost control circuit 320. The boost-buck control circuit 300 is configured to output a boost control signal BOV and a buck control signal BUC.

The logic control circuit 400 is connected to the output terminal of the first comparator 100 and the boost-buck control circuit 300. The logic control circuit 400 may determine whether or not a boost-buck control signal having a boost mode induction message is outputted to the switch circuit 500, according to the first voltage compared signal VCAPSHORT of the first comparator 100. More specifically, the logic control circuit 400 may output the boost control signal BOV to the switch circuit 500 according to the first voltage compared signal VCAPSHORT at a low level. Conversely, the logic control circuit 400 may not switch the switch circuit 500 according to the first voltage compared signal VCAPSHORT at a high level.

The switch circuit 500 is connected between the power supply device and the power storage device. That is, the switch circuit 500 is connected between a terminal of the power supply device through which the supplied power VIN is outputted and a terminal of the power storage device through which the stored power VCAP is outputted. In addition, the switch circuit 500 is connected to the logic control circuit 400. The logic control circuit 400 receives the boost control signal BOV and the buck control signal BUC from the boost-buck control circuit 300. The logic control circuit 400 transmits the boost control signal BOV to the switch circuit 500 to control a duty cycle of the switch circuit 500 such that the switch circuit 500 operates in the boost mode, according to the first voltage compared signal VCAPSHORT at the low level. Conversely, the logic control circuit 400 does not switch the switch circuit 500 according to the first voltage compared signal VCAPSHORT at the high level.

The power supply device may provide the supplied voltage VIN to charge an input capacitor CIN and provide electric energy to be stored in a storage inductor L. The supplied voltage VIN is boosted through the storage inductor L and the switch circuit 500 to charge the storage capacitor CAP of the power storage device.

In detail, the switch circuit 500 includes an upper bridge switch UG and a lower bridge switch LG. For example, the upper bridge switch UG and the lower bridge switch LG are N-channel enhancement MOSFETs, but the present disclosure is not limited thereto. Control terminals such as gate terminals of the upper bridge switch UG and the lower bridge switch LG are connected to an output terminal of the logic control circuit 400. The logic control circuit 400 controls the upper bridge switch UG and the lower bridge switch LG.

A first terminal such as a drain terminal of the upper bridge switch UG is connected to an upper terminal of the storage capacitor CAP of the power storage device. A second terminal such as a source terminal of the upper bridge switch UG is connected to a first terminal such as a drain terminal of the lower bridge switch LG. A second terminal such as a source terminal of the lower bridge switch LG is grounded. The power supply device and an upper terminal of the input capacitor CIN are connected to a node LX between the second terminal of the upper bridge switch UG and the first terminal of the lower bridge switch LG through the storage inductor L. A lower terminal of the input capacitor CIN is grounded.

The current sensor circuit 600 is connected to the first terminal such as the drain and the second terminal such as the source terminal of the lower bridge switch LG of the switch circuit 500. The current sensor circuit 600 is configured to sense a current flowing through the switch circuit 500. More specifically, the current sensor circuit 600 senses the current flowing from the first terminal of the lower bridge switch LG to the second terminal of the lower bridge switch LG. The current sensor circuit 600 may then output the sensed current.

The current slope comparator circuit 700 is connected to the current sensor circuit 600 and the mode switching circuit 800. The current slope comparator circuit 700 may store a reference current. For example, the reference current may be the current sensed by the current sensor circuit 600. The current slope comparator circuit 700 is configured to compare a positive slope of the sensed current with a slope of the reference current, and accordingly determine whether or not the positive slope of the sensed current is decreasing to output a current slope changing signal ISL.

When the current slope comparator circuit 700 determines that the slope of the sensed current is not decreasing, the mode switching circuit 800 may instruct the logic control circuit 400 to control the switch circuit 500 to continually operate in the boost mode, according to the current slope changing signal ISL from the current slope comparator circuit 700.

Conversely, when the current slope comparator circuit 700 determines that the slope of the sensed current is decreasing, the current slope comparator circuit 700 outputs the current slope changing signal ISL indicating that the positive slope is decreasing to the mode switching circuit 800.

Further, the second comparator 200 has a third comparison input terminal and a fourth comparison input terminal. The third comparison input terminal such as a non-inverting terminal of the second comparator 200 is connected to the upper terminal of the storage capacitor CAP of the power storage device. The fourth comparison input terminal such as an inverting terminal of the second comparator 200 is connected to a second reference voltage source VREF2 and receives a second reference voltage from the second reference voltage source VREF2.

An output terminal of the second comparator 200 is connected to the mode switching circuit 800. The second comparator 200 is configured to compare the voltage of the stored power VCAP of the power storage device (that is, the voltage of the storage capacitor CAP) with the second reference voltage of the second reference voltage source VREF2 to output a second voltage compared signal VCAPOK to the mode switching circuit 800.

For example, when the voltage of the stored power VCAP of the power storage device is lower than the voltage of the second reference voltage of the second reference voltage source VREF2, the second comparator 200 outputs the second voltage compared signal VCAPOK at a low level to the mode switching circuit 800. The mode switching circuit 800 instructs the logic control circuit 400 to control the switch circuit 500 to operate in the boost mode according to the second voltage compared signal VCAPOK.

Conversely, when the current slope comparator circuit 700 determines that the slope of the sensed current is decreasing to output the current slope changing signal ISL, and the second comparator 200 determines that the voltage of the stored power VCAP is higher than the second reference voltage to output the second voltage compared signal VCAPOK at a high level, the mode switching circuit 800 instructs the logic control circuit 400 to switch the switch circuit 500 to operate in the buck mode.

When the switch circuit 500 operates in the buck mode, the switch circuit 500 may allow the stored power VCAP supplied by the power storage device to be bucked to obtain the supplied power VIN by the switch circuit 500, the input capacitor CIN and the storage inductor L. When the power supply device is abnormally powered down, the power supply device can obtain the supplied power VIN that is bucked from the stored power VCAP as the backup power and provides the supplied power VIN to other circuit components. Under this condition, the other circuit components can continually execute unfinished programs that are not damaged by abnormal power failure, for example, a memory device can continually access data, without waiting until power is restored.

Figure 2:
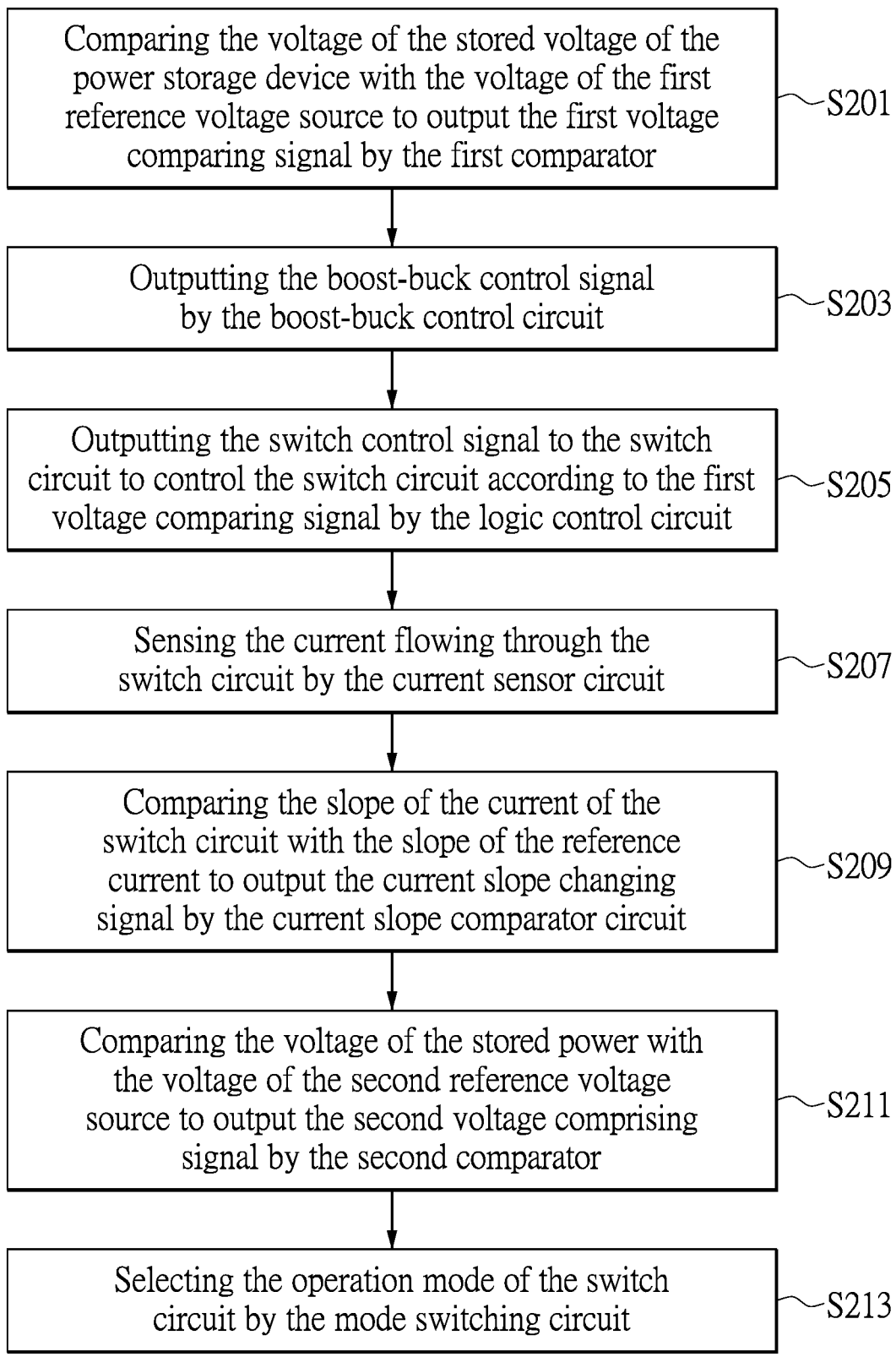
FIG. 2 is a flowchart diagram of an abnormal power failure control method according to a second embodiment of the present disclosure.

Reference is made to FIG. 2, which is a flowchart diagram of an abnormal power failure control method according to a second embodiment of the present disclosure. As shown in FIG. 2, in the embodiment, the abnormal power failure control method includes the following steps S201 to S213, which may use the above abnormal power failure control system. The abnormal power failure control system includes the first comparator, the boost-buck control circuit, the logic control circuit, the switch circuit, the current sensor circuit, the current slope comparator circuit, the second comparator and the mode switching circuit. The power storage device stores the supplied power provided by the power supply device in the boost mode. The power storage device provides the stored power to the power supply device and the power supply device supplies the stored power in the buck mode.

In step S201, the first comparator compares the voltage of the stored power of the power storage device with the voltage of the first reference voltage source to output the first voltage compared signal.

In step S203, the boost-buck control circuit outputs the boost-buck voltage control signal.

In step S205, the logic control circuit determines whether or not the boost-buck voltage control signal having the boost mode induction message is outputted to the switch circuit such that the switch circuit is switched to operate in the boost mode, according to the first voltage compared signal.

In step S207, the current sensor circuit senses the current flowing through the switch circuit.

In step S209, the current slope comparator circuit compares the slope of the current sensed by the current sensor circuit with the slope of the reference current to output the current slope changing signal.

In step S211, the second comparator compares the voltage of the stored power with the voltage of the second reference voltage source to output the second voltage compared signal.

In step S213, the mode switching circuit determines whether the mode switching circuit controls the logic circuit to switch the switch circuit to operate in different modes, according to the current slope changing signal generated in step S209 and the second voltage compared signal generated in step S211. For example, the switch circuit is switched to operate in the boost mode from the buck mode, or is switched to operate in the buck mode from the boost mode.

Figure 3:
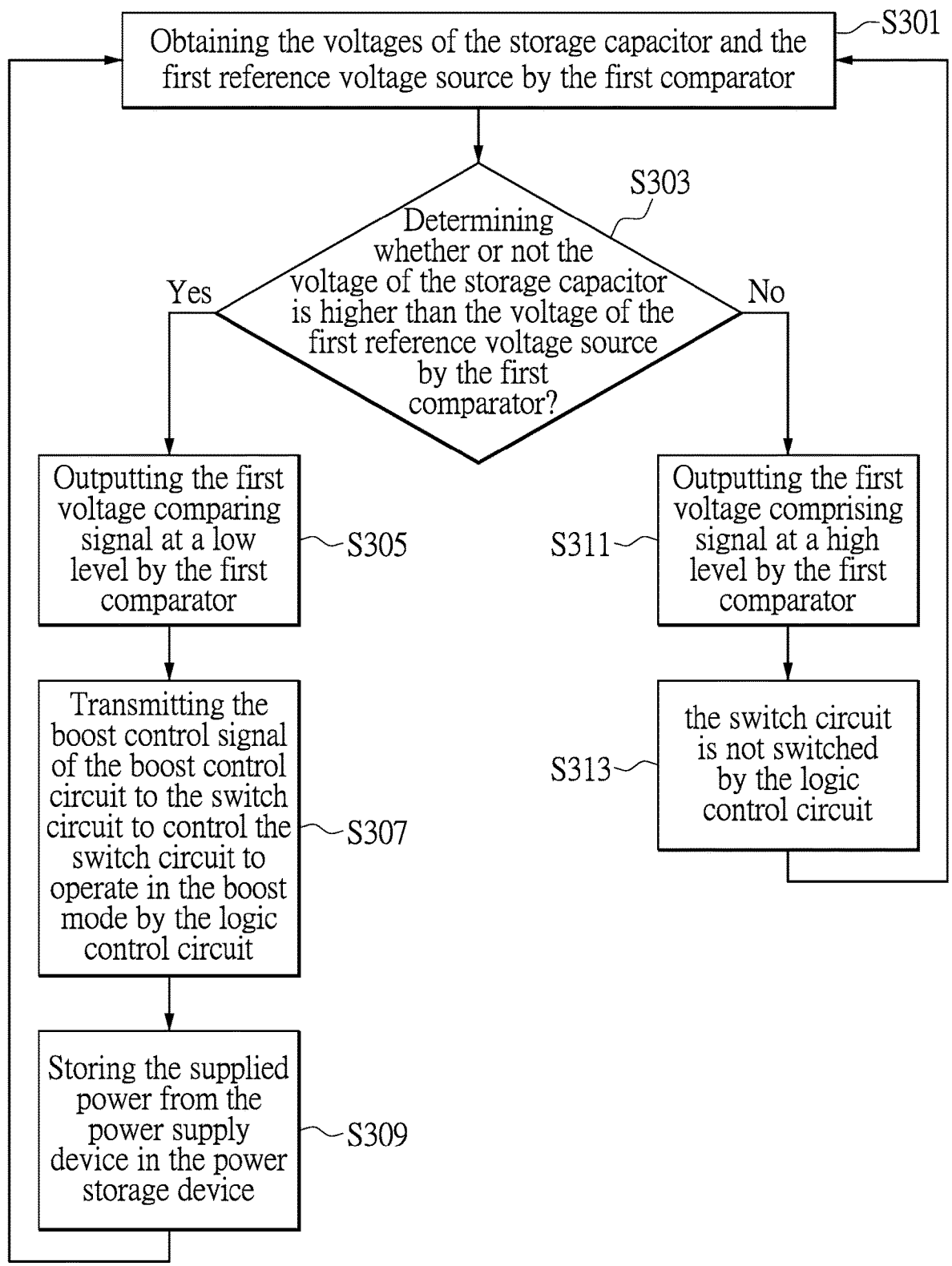
FIG. 3 is a flowchart diagram of an abnormal power failure control method according to a third embodiment of the present disclosure.

Reference is made to FIG. 3, which is a flowchart diagram of an abnormal power failure control method according to a third embodiment of the present disclosure. As shown in FIG. 3, in the embodiment, the abnormal power failure control method includes the following steps S301 to S313, which may use the above abnormal power failure control system. The abnormal power failure control system includes the first comparator, the boost control circuit, the switch circuit and the logic control circuit. When the voltage of the storage capacitor is higher than the voltage of the first reference voltage source, the abnormal power failure control system enters the boost mode to control the power supply device to provide the supplied power to be stored in the power storage device. When the voltage of the storage capacitor is lower than the voltage of the first reference voltage source, the switch circuit is not switched.

In step S301, the first comparator obtains the voltage of the storage capacitor of the power storage device and the voltage of the first reference voltage source.

In step S303, the first comparator determines whether or not the voltage of the storage capacitor of the power storage device is higher than the voltage of the first reference voltage source.

If the first comparator determines that the voltage of the storage capacitor of the power storage device is higher than the voltage of the first reference voltage source, the following steps S305 to S309 are sequentially performed.

In step S305, the first comparator outputs the first voltage compared signal at a low level.

In step S307, the logic control circuit transmits the boost control signal from the boost control circuit to the switch circuit to control the switch circuit to operate in the boost mode, according to the first voltage compared signal at the low level from the first comparator.

In step S309, the power storage device stores the supplied power provided by the power supply device in the boost mode.

Conversely, if the first comparator determines that the voltage of the storage capacitor of the power storage device is not higher than the voltage of the first reference voltage source in step S303, the following steps S311 and S313 are sequentially performed.

In step S311, the first comparator outputs the first voltage compared signal at a high level.

In step S313, the logic control circuit does not switch the switch circuit according to the first voltage compared signal at the high level.

Further, steps S301 to S313 may be continuously performed until the switch circuit enters the boost mode.

Figure 4:
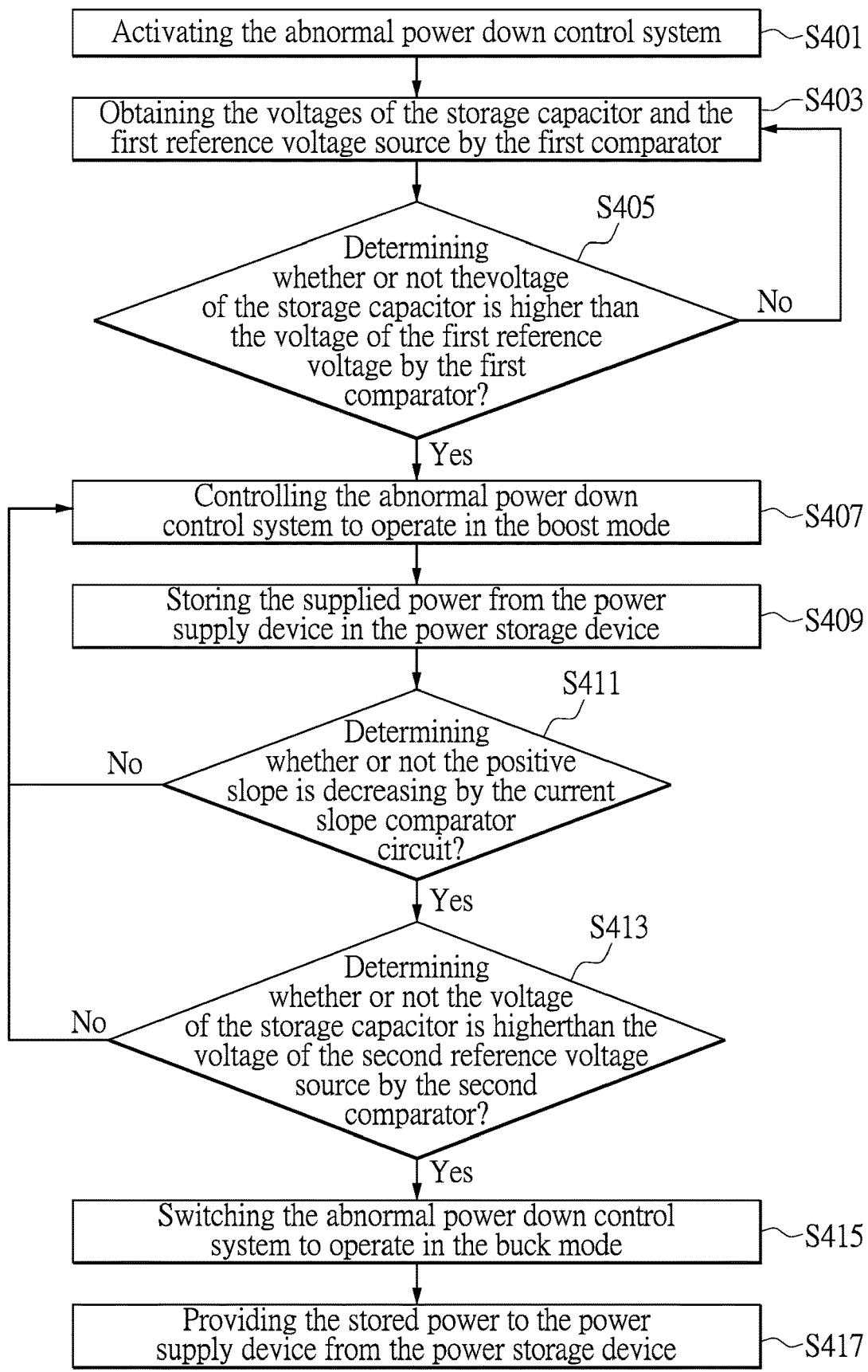
FIG. 4 is a flowchart diagram of an abnormal power failure control method according to a fourth embodiment of the present disclosure.

Reference is made to FIG. 4, which is a flowchart diagram of an abnormal power failure control method according to a fourth embodiment of the present disclosure. As shown in FIG. 4, in the embodiment, the abnormal power failure control method includes the following steps S401 to S417, which may use the above abnormal power failure control system. In the boost mode, the power supply device provides the supplied power to the power storage device and the power storage device stores the supplied power. In the buck mode, the power storage device provides the stored power to the power supply device and the power supply device supplies the stored power.

In step S401, the abnormal power failure control system is activated.

In step S403, the first comparator of the abnormal power failure control system obtains the voltage of the storage capacitor and the voltage of the first reference voltage source.

In step S405, the first comparator of the abnormal power failure control system determines whether or not the voltage of the storage capacitor is higher than the voltage of the first reference voltage source. If the first comparator determines that the voltage of the storage capacitor is not higher than the voltage of the first reference voltage source, step S403 is performed again. Conversely, if the first comparator determines that the voltage of the storage capacitor is higher than the voltage of the first reference voltage source, step S407 is performed.

In step S407, the abnormal power failure control system enters the boost mode.

In step S409, the abnormal power failure control system controls the power supply device to provide the supplied power to the power storage device and controls the power storage device to store the supplied power.

In step S411, the current slope comparator circuit determines whether or not the positive slope is decreasing. For example, the current slope comparator circuit determines whether or not the positive slope decreases relative to the slope of the reference current. If the current slope comparator circuit determines that the positive slope is not decreasing, steps S407 and S409 are performed continually. In steps S407 and S409, the abnormal power failure control system operates in the boost mode. Conversely, the current slope comparator circuit determines that the positive slope is decreasing, step S413 is performed.

In step S413, the second comparator determines whether or not the voltage of the storage capacitor is higher than the voltage of the second reference voltage source. If the second comparator determines that the voltage of the storage capacitor is not higher than the voltage of the second reference voltage source, steps S407 to S411 are continually performed. Conversely, if the second comparator determines that the voltage of the storage capacitor is higher than the voltage of the second reference voltage source, step S415 is then performed.

In step S415, the abnormal power failure control system is switched to operate in the buck mode.

In step S417, the abnormal power failure control system controls the power storage device to provide the stored power to the power supply device and controls the power supply device to supply the stored power.

Figure 5:
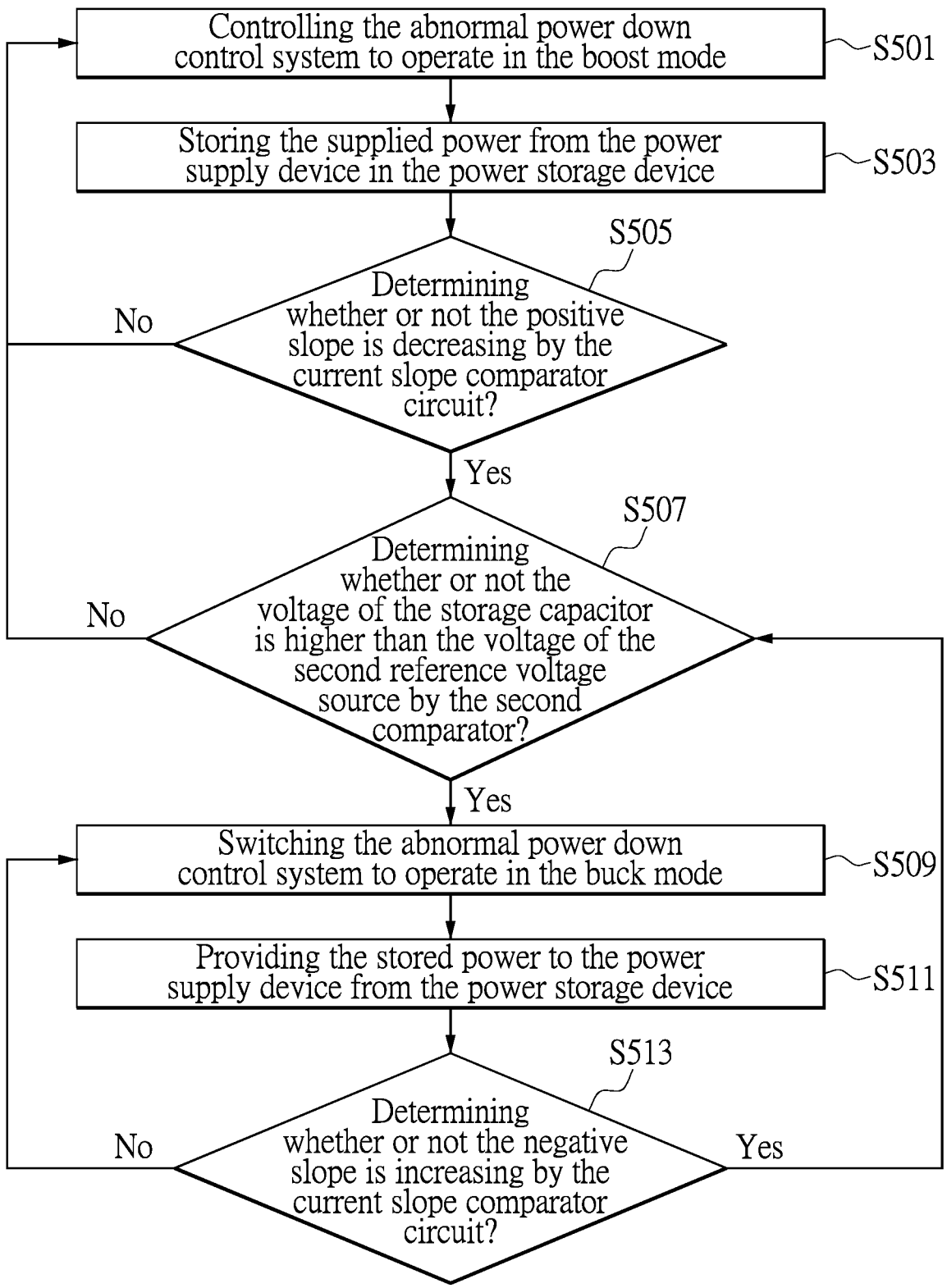
FIG. 5 is a flowchart diagram of an abnormal power failure control method according to a fifth embodiment of the present disclosure.

Reference is made to FIG. 5, which is a flowchart diagram of an abnormal power failure control method according to a fifth embodiment of the present disclosure. As shown in FIG. 5, in the embodiment, the abnormal power failure control method includes the following steps S501 to S513, which may use the above abnormal power failure control system. The power storage device stores the supplied power provided by the power supply device in the boost mode. The power storage device provides the stored power to the power supply device and the power supply device supplies the stored power in the buck mode.

In step S501, the abnormal power failure control system operates in the boost mode.

In step S503, the abnormal power failure control system controls the power supply device to provide the supplied power to the power storage device and controls the power storage device to store the supplied power.

In step S505, the current slope comparator circuit determines whether or not the positive slope of the current that flows through the switch circuit and sensed by the current sensor circuit is decreasing. If the current slope comparator circuit determines that the positive slope of the current is not decreasing, steps S501 to S505 are continually performed. In steps S501 to S505, the abnormal power failure control system operates in the boost mode. Conversely, if the current slope comparator circuit determines that the positive slope of the current is decreasing, step S507 is then performed.

In step S507, the second comparator determines whether or not the voltage of the storage capacitor of the power storage device is higher than the voltage of the second reference voltage source. If the second comparator determines that the voltage of the storage capacitor of the power storage device is not higher than the voltage of the second reference voltage source, steps S501 to S505 are continually performed. Conversely, if the second comparator determines that the voltage of the storage capacitor of the power storage device is higher than the voltage of the second reference voltage source, step S509 is then performed.

In step S509, the abnormal power failure control system is switched to operate in the buck mode.

In step S511, the abnormal power failure control system controls the power storage device to supply the stored power to the power supply device and controls the power supply device to provide the stored power.

In step S513, the current comparator circuit determines whether or not the negative slope of the current that flows through the switch circuit and sensed by the current sensor circuit is increasing. The current comparator circuit determines that the negative slope of the current is not increasing, steps S509 and S511 are continually performed. Conversely, the current comparator circuit determines that the negative slope of the current is increasing, step S507 is performed again.

In summary, the present disclosure provides the abnormal power failure control system and method, which may enter the boost mode to control the power storage device to store the supplied power provided by the power supply device when the power supply device can be normally powered. However, when the power supply device is abnormally powered down, the abnormal power failure control system is switched to operate in the buck mode, and controls the power supply device to obtain the stored power from the power storage device as a backup power supply device and then supply the stored power to the other circuit components. Under this condition, the other circuit components can continually execute the unfinished programs that are not damaged by the abnormal power, for example, the memory device can continually access the data, without waiting until the power is restored.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An abnormal power failure control system, which is applicable for a power supply device and a power storage device, the power storage device storing a supplied power provided by the power supply device in a boost mode, the power storage device providing a stored power to the power supply device and the power supply device supplying the stored power in a buck mode, the abnormal power failure control system comprising:
- a first comparator having a first comparison input terminal and a second comparison input terminal, which are respectively connected to a first reference voltage source and the power storage device, the first comparator being configured to compare the stored power with a voltage of the first reference voltage source to output a first voltage compared signal;
- a boost-buck control circuit configured to output a boost-buck control signal;
- a logic control circuit connected to output terminals of the boost-buck control circuit and the first comparator, and configured to determine whether or not the logic control circuit transmits the boost-buck control signal having a boost mode induction message according to the first voltage compared signal;
- a switch circuit connected between the power supply device and the power storage device and to the logic control circuit, configured to be switched to operate in the boost mode and boost the supplied power to obtain the stored power to be stored based on the boost-buck control signal, or to not be switched;
- a current sensor circuit connected to the switch circuit and configured to sense a current flowing through the switch circuit;
- a current slope comparator circuit connected to the current sensor circuit and configured to compare a slope of the current with a slope of a reference current to output a current slope changing signal;
- a second comparator having a third comparison input terminal and a fourth comparison input terminal, which are respectively connected to the power storage device and a second reference voltage source, the second comparator being configured to compare the stored power with a voltage of the second reference voltage source to output a second voltage compared signal; and
- a mode switching circuit connected to the current slope comparator circuit and the second comparator, configured to instruct the logic control circuit to control the switch circuit to operate in the boost mode or switch the switch circuit to operate in the buck mode according to the current slope changing signal and the second voltage compared signal, and configured to allow the supplied power to be boosted by the switch circuit to obtain the stored power to be stored in the boost mode, or allow the stored power to be bucked by the switch circuit to obtain the supplied power to be supplied in the buck mode.

2. The abnormal power failure control system of claim 1, wherein the switch circuit includes an upper bridge switch and a lower bridge switch, a control terminal of the upper bridge switch and a control terminal of the lower bridge switch are connected to the logic control circuit, a first terminal of the upper bridge switch is connected to the power storage device, a second terminal of the upper bridge switch is connected to a first terminal of the lower bridge switch, a second terminal of the lower bridge switch is grounded, the power supply device is connected to a node between the second terminal of the upper bridge switch and the first terminal of the lower bridge switch through an inductor;
the current sensor circuit is connected to the first terminal and the second terminal of the lower bridge switch, and configured to sense the current flowing through the first terminal and the second terminal of the lower bridge switch.

3. The abnormal power failure control system of claim 1, wherein when the first comparator determines that the stored voltage is higher than the voltage of the first reference voltage source, the switch circuit operates in the boost mode;
when the first comparator determines that the stored voltage is not higher than the voltage of the first reference voltage source, the switch circuit is not switched;
when the current slope comparator circuit determines that a positive slope of the current in the boost mode does not decrease relative to the reference current, the logic control circuit controls the switch circuit to continually operate in the boost mode according to the current slope changing signal;
when the current slope comparator circuit determines that the positive slope of the current in the boost mode decreases relative to the reference current, the second comparator compares the stored power with the voltage of the second reference voltage source;
when the second comparator determines that the stored power is lower than the voltage of the second reference voltage source, the switch circuit and the power supply device continually operate in the boost mode;
when the second comparator determines that the stored power is higher than the voltage of the second reference voltage source, the switch circuit and the power supply device are switched to operate in the buck mode.

4. The abnormal power failure control system of claim 1, wherein when the current slope comparator circuit determines that a negative slope of the current in the buck mode does not increase relative to the reference current, the logic control circuit controls the switch circuit to continually operate in the buck mode;
when the current slope comparator circuit determines that the negative slope of the current in the buck mode increases relative to the reference current, the second comparator compares the stored power with the voltage of the second reference voltage source;
when the second comparator determines that the stored power is higher than the voltage of the second reference voltage source, the switch circuit and the power supply device continually operate in the buck mode;
when the second comparator determines that the stored power is lower than the voltage of the second reference voltage source, the switch circuit and the power supply device are switched to operate in the boost mode.

5. An abnormal power failure control method, which is applicable for a power supply device and a power storage device, the power storage device storing a supplied power provided by the power supply device in a boost mode, the power storage device providing a stored power to the power supply device and the power supply device supplying the stored power in a buck mode, the abnormal power failure control method comprising the following steps:
- comparing the stored power with a voltage of a first reference voltage source to output a first voltage compared signal by a first comparator;
- outputting a boost-buck control signal by a boost-buck control circuit;
- determining whether or not a logic control circuit transmits the boost-buck control signal having a boost mode induction message to a switch circuit to switch the switch circuit to operate in the boost mode, according to the first voltage compared signal by the logic control circuit;

sensing a current flowing through the switch circuit by a current sensor circuit;

comparing a slope of the current with a slope of a reference current to output a current slope changing signal by a current slope comparator circuit;

comparing the stored power with a voltage of a second reference voltage source to output a second voltage compared signal by a second comparator; and instructing the logic control circuit to control the switch circuit to continuously operate in the boost mode or switch the switch circuit to operate in the buck mode according to the current slope changing signal and the second voltage compared signal by a mode switching circuit;

wherein when the switch circuit operates in the boost mode, the supplied power is allowed to be boosted by the switch circuit to obtain the stored power to be stored, and when the switch circuit operates in the buck mode, the stored power is allowed to be bucked by the switch circuit to obtain the supplied power to be supplied in the buck mode.

6. The abnormal power failure control method of claim 5, further comprising steps of:

determining whether or not the stored power is higher than the voltage of the first reference voltage source by the first comparator, in response to determining that the stored power is not higher than the voltage of the first reference voltage source, comparing the stored power with the voltage of the first reference voltage, in response to determining that the stored power is higher than the voltage of the first reference voltage source, the switch circuit operates in the boost mode; and determining whether or not a positive slope of the current in the boost mode decreases relative to the reference current by the current slope comparator circuit, in response to determining that the positive slope of the current in the boost mode does not decrease relative to the reference current, the logic control circuit controls the switch circuit to continually operate in the boost mode according to the current slope changing signal;

in response to determining that the positive slope of the current in the boost mode decreases relative to the reference current, determining whether or not the stored power is higher than the voltage of the second reference voltage source by a second comparator, in response to determining that the stored power is not higher than the voltage of the second reference voltage source, the switch circuit and the power supply device continually operate in the boost mode, and in response to determining that the stored power is higher than the voltage of the second reference voltage source, the switch circuit and the power supply device are switched to operate in the buck mode.

7. The abnormal power failure control method of claim 5, further comprising steps of:

outputting the switch control signal to control the switch circuit to operate in the buck mode by the logic control circuit; and determining whether or not a negative slope of the current in the buck mode increases relative to the reference current by the current slope comparator circuit, in response to determining that the negative slope of the current in the buck mode does not increase relative to the reference current, the logic control circuit controls the switch circuit to continually operate in the buck mode;

in response to determining that the negative slope of the current in the buck mode increases relative to the reference current, determining whether or not the stored power is higher than the voltage of the second reference voltage source by a second comparator, in response to determining that the stored power is higher than the voltage of the second reference voltage source, the switch circuit and the power supply device continually operate in the buck mode, in response to determining that the stored power is not higher than the voltage of the second reference voltage source, the switch circuit and the power supply device are switched to operate in the boost mode.

* * * * *